(12) United States Patent
McKinlay et al.

(10) Patent No.: US 8,760,820 B1
(45) Date of Patent: Jun. 24, 2014

(54) MAGNETIC ELEMENT WITH COUPLED SIDE SHIELD

(71) Applicant: Seagate Technology LLC, Cupertino, CA (US)

(72) Inventors: Shaun Eric McKinlay, Eden Prairie, MN (US); Liwen Tan, Eden Prairie, MN (US); Eric Walter Singleton, Maple Plain, MN (US); Mohammed Shariat Ullah Patwari, Eden Prairie, MN (US); Victor Boris Sapozhnikov, Minnetonka, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/690,204

(22) Filed: Nov. 30, 2012

(51) Int. Cl.
*G11B 5/39* (2006.01)
(52) U.S. Cl.
USPC .................................. 360/319; 360/324.12
(58) Field of Classification Search
CPC .............................. G11B 5/3912; G11B 5/39
USPC ....................................... 360/324–324.2, 319
See application file for complete search history.

(56) References Cited

U.S. PATENT DOCUMENTS

| 5,515,221 | A | 5/1996 | Gill et al. |
|---|---|---|---|
| 6,018,443 | A | 1/2000 | Watanabe et al. |
| 6,597,546 | B2 | 7/2003 | Gill |
| 6,700,760 | B1 | 3/2004 | Mao |
| 6,710,982 | B2 | 3/2004 | Mack et al. |
| 7,236,333 | B2 | 6/2007 | Macken |
| 7,295,401 | B2* | 11/2007 | Jayasekara et al. ...... 360/125.08 |
| 7,599,151 | B2* | 10/2009 | Hatatani et al. .............. 360/319 |
| 7,606,007 | B2 | 10/2009 | Gill |
| 8,089,734 | B2* | 1/2012 | Miyauchi et al. ............. 360/319 |
| 8,130,475 | B2* | 3/2012 | Kawamori et al. ...... 360/324.12 |
| 8,189,303 | B2 | 5/2012 | Hara et al. |
| 8,437,106 | B2* | 5/2013 | Yanagisawa et al. ......... 360/319 |
| 2008/0253037 | A1 | 10/2008 | Kagami et al. |
| 2009/0279213 | A1 | 11/2009 | Wu et al. |
| 2010/0027168 | A1 | 2/2010 | Chou et al. |
| 2011/0279923 | A1 | 11/2011 | Miyauchi et al. |
| 2012/0087045 | A1* | 4/2012 | Yanagisawa et al. ......... 360/294 |
| 2012/0087046 | A1* | 4/2012 | Yanagisawa et al. ......... 360/294 |
| 2012/0250189 | A1* | 10/2012 | Degawa et al. ............ 360/235.4 |
| 2012/0281319 | A1* | 11/2012 | Singleton et al. ............. 360/319 |

FOREIGN PATENT DOCUMENTS

| JP | 2005203063 A | * | 7/2005 |
|---|---|---|---|
| JP | 2010044848 A | * | 2/2010 |
| JP | 2012234617 A | * | 11/2012 |

* cited by examiner

*Primary Examiner* — Will J Klimowicz
(74) *Attorney, Agent, or Firm* — Hall Estill Attorneys at Law

(57) ABSTRACT

A magnetic element may be constructed in accordance with various embodiments as a data reader. The magnetic element can have at least a magnetic reader that contacts a top shield and is separated from a side shield on an air bearing surface (ABS). The side shield may be antiferromagnetically coupled to the top shield via a coupling layer disposed between the top and side shields.

20 Claims, 4 Drawing Sheets

MAGNETIC ELEMENT WITH COUPLED SIDE SHIELD

SUMMARY

Various embodiments may be generally directed to a magnetic element configured as a data reader.

In accordance with various embodiments, a magnetic element can have at least a magnetic reader that contacts a top shield and is separated from a side shield on an air bearing surface (ABS). The side shield may be antiferromagnetically coupled to the top shield via a coupling layer disposed between the top and side shields

DETAILED DESCRIPTION

Industry has continually strived for increased data storage capacity and reliability with faster data access times. Such performance can correspond with reduced form factor data storage components and increased data bit areal density that may utilize one or more magnetic shields to increase data resolution. However, reduction of the physical size of magnetic side shields combined with reduced data track width can correspond to inadvertent sensing of data bits from proximal data tracks, which may produce magnetic asymmetry and reduced data bit readback. Thus, there is a continued interest in reducing the physical size of magnetic shields while maintaining data resolution.

Accordingly, a magnetic element can be configured as a data sensing device in which a data reader contacts a top shield while being separated from a side shield on an air bearing surface (ABS). The side shield may be antiferromagnetically coupled to the top shield, which can reduce inadvertent sensing of data bits. By replacing a high coercivity magnetic side shield with a relatively low coercivity ferromagnetic material that is magnetically coupled to the top shield, the data reader may experience more precise bias magnetizations while having reduced stray magnetic field sensitivity. The coupling between the side and top shields can further stabilize the magnetization of the side shield with minimum processing complexity.

Figure 1:
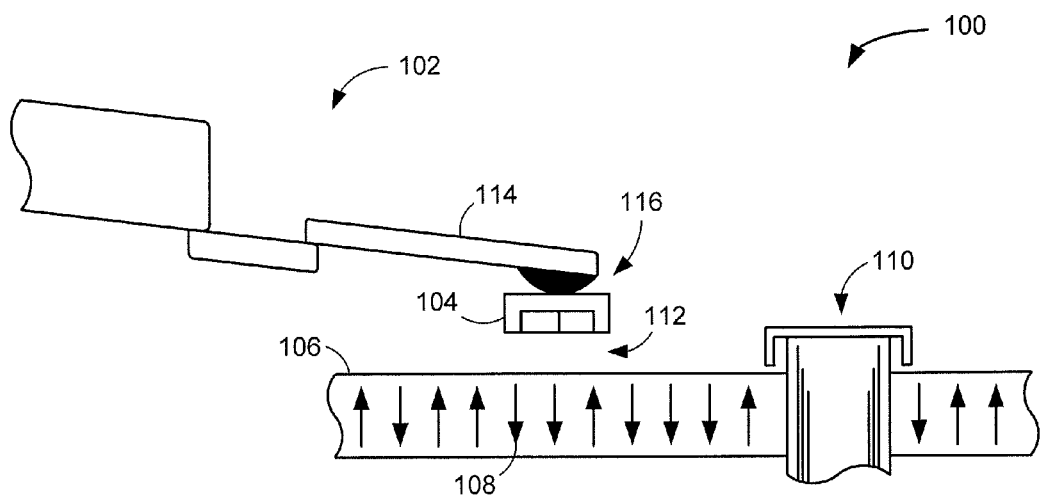
FIG. 1 generally provides of an example data storage device in accordance with various embodiments.

While a magnetic element with magnetically coupled side shields can be practiced in a variety of non-limiting environments, FIG. 1 generally displays a data transducing portion 100 of an example data storage device. The transducing portion 100 is configured with an actuating assembly 102 that positions a transducing head 104 over programmed data bits 108 present on a magnetic storage media 106 that is attached to, and rotates about, a spindle motor 110 to produce an air bearing surface (ABS) 112. The speed in which the spindle motor 110 rotates allows a slider portion 114 of the actuating assembly 102 to fly on the ABS to position a head gimbal assembly (HGA) 116, which includes the transducing head 104, over a desired portion of the media 106.

The transducing head 104 can include one or more transducing elements, such as a magnetic writer and magnetically responsive reader, which operate to program data to and read data from the storage media 108, respectively. In this way, controlled motion of the actuating assembly 102 and spindle motor 110 can modulate the position of the transducing head both laterally along predetermined data tracks (not shown) defined on the storage media surfaces and vertically as measured perpendicularly to the media surface to selectively write, read, and rewrite data.

Figure 2:
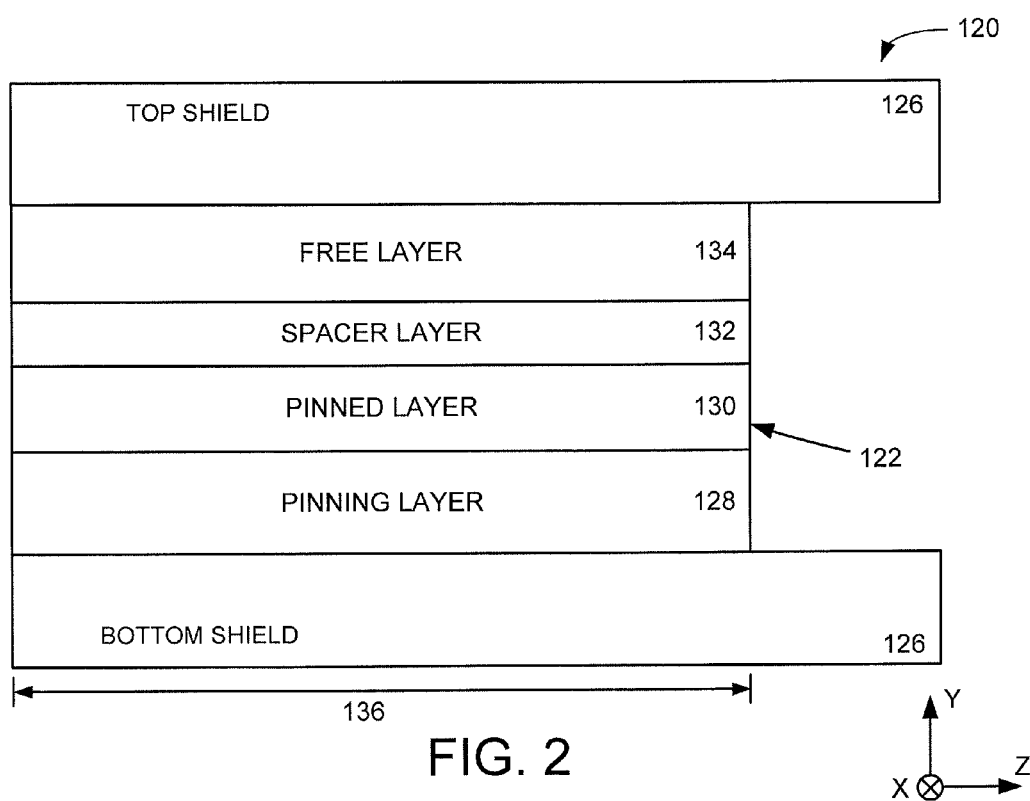
FIG. 2 is a cross-section block representation of an example magnetic element constructed in accordance with some embodiments.

FIG. 2 shows a cross-sectional block representation of an example magnetic data reader 120 capable of being used in the transducing portion 100 of a data storage device shown in FIG. 1. While not required or limited to the configuration shown in FIG. 2, the magnetic reader 120 has a magnetic stack 122 disposed between magnetic shields 126 on an air bearing surface (ABS). The magnetic stack 122 can be configured as a variety of different data bit sensing laminations, such as a magnetoresistive, tunnel magnetoresistive, spin valve, and a "trilayer" sensor with dual ferromagnetic free layers and without a fixed magnetization reference structure, but in the embodiment shown in FIG. 2, an abutted junction (HMRB) stack characterized by a fixed reference structure containing pinning 128 and pinned 130 layers opposite a non-magnetic spacer layer 132 from a magnetically free layer 134.

The magnetic orientation of the free layer 134 may act to provide a measureable magnetoresistive effect when an external data bit is encountered and alters between quiescent and activated states as measured against the fixed magnetization of the pinned layer 130. The magnetic stack 122 can be tuned to a predetermined stripe height 136 as measured from the ABS along the Z axis. Regardless of the stripe height 136 and construction of the magnetic stack 122, the magnetic size of the magnetic stack 122 on the ABS may be too large and sensitive to distinguish data bits on adjacent data tracks, particularly in reduced form factor, high areal bit density data storage devices.

Figure 3:
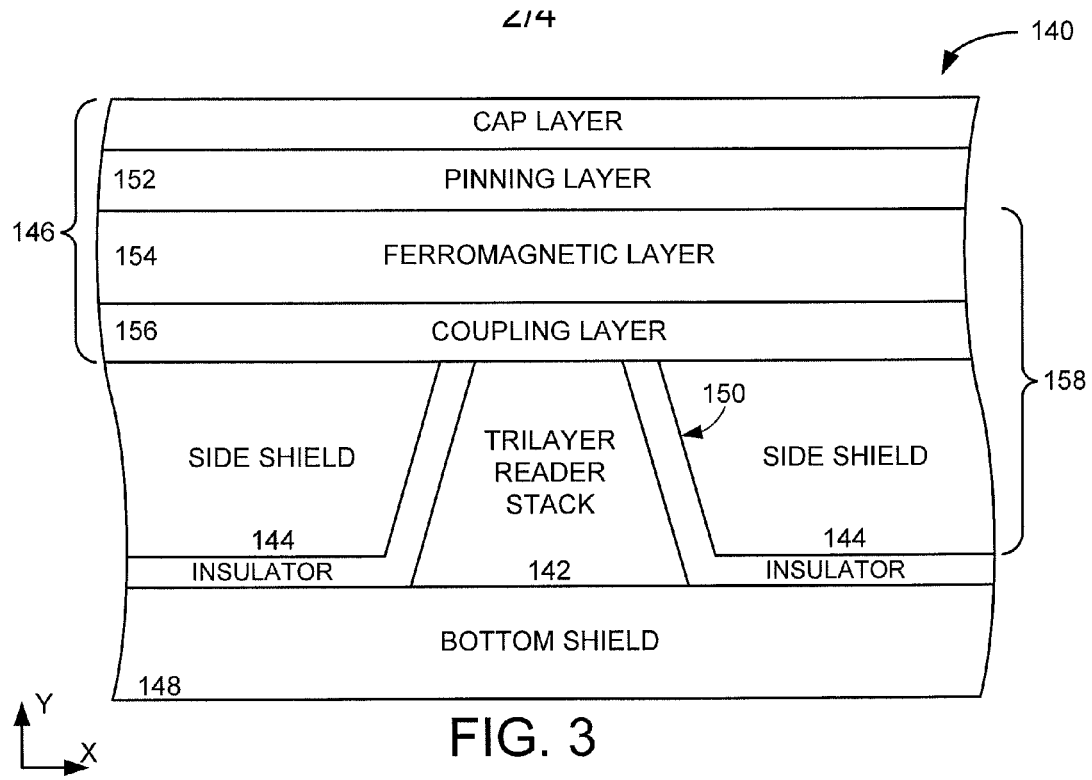
FIG. 3 generally illustrates an embodiment of a magnetic element capable of being used in the portion of the data storage device of FIG. 1 in some embodiments.

FIG. 3 displays a block representation of an ABS portion of an example magnetic data reader 140 in accordance with various embodiments. The magnetic data reader 140 may be constructed with an unlimited variety of shield configurations, but in some embodiments a magnetic reader stack 142 is disposed laterally between side shields 144 and vertically between top 146 and bottom 148 shields. The magnetic reader stack 142 can be configured in any variety of rectangular, square, curvilinear, and shaped structures, but is shown in FIG. 3 substantially as a trapezoid defined by an increased width surface contacting the bottom shield 148 compared to the reduced width surface contacting the top shield 146. Such a trapezoidal shape can provide tapered sidewalls that can be oriented parallel or dissimilar from the reader stack 142 facing surface 150 of the side shields 144 to produce a predetermined gap between the side shield 144 and reader stack 142.

The side shields 144 positioned on opposite sides of the magnetic reader stack 142 can be tuned to individually unique or common materials, number of layers, and shape to decrease magnetic asymmetry in the reader stack 142 and reduce sensitivity to stray magnetic fields. When one or both of the side shields 144 are constructed as a high magnetic coercivity structure that is coupled to the top 146 and bottom 148 shield, the magnetic reader stack 142 can experience variable magnetic biasing as the high coercivity side shield 144 responds too sensitively to variations in magnetic fields. Replacement of hard magnetic material with soft magnetic material that is decoupled from the top 146 and bottom 148 shields can alleviate some of the stray field sensitivity while providing increased readers stack 142, but the magnetic moment of such a side shield can have inconsistent magnetization response to cross-track magnetic fields that corresponds with increased noise in the reader stack 142.

In view of such sensitivities and inconsistent magnetization behavior, the top shield 146 can be configured as a lamination of a pinning layer 152, such as an antiferromagnet (AFM), a ferromagnetic layer 154, and a coupling layer 156, such as a transition metal like Ruthenium, that increases the intrinsic magnetic stability of the top shield 146 while coupling the side 144 and top 146 shields via the coupling layer 156. Hence, when the side shield 144 is constructed of a ferromagnetic material and the coupling layer 156 is disposed between a pinned ferromagnetic layer 154 and an unpinned side shield 144, antiferromagnetic coupling can be formed between the side 144 and top 146 shields 144 that can be characterized as a synthetic antiferromagnet 158 structure (SAFS).

It should be noted that the configuration of the coupling layer 156 as continuously extending to contact both side shields 144 and the magnetic reader stack 142 allows for simple processing, biasing of portions of the magnetic reader stack 142, and the formation of separate SAFS as the top shield 146 lamination antiferromagnetically couples to each respective side shield 144. The ability to tune the shape, thickness, anisotropy, and materials of the side shields 144, coupling layer 156, and ferromagnetic layer 154 provides a variety of coupling options catered to the construction of the magnetic reader stack 142, such as the stripe height, trilayer laminated structure, and reader stack width.

Figure 4:
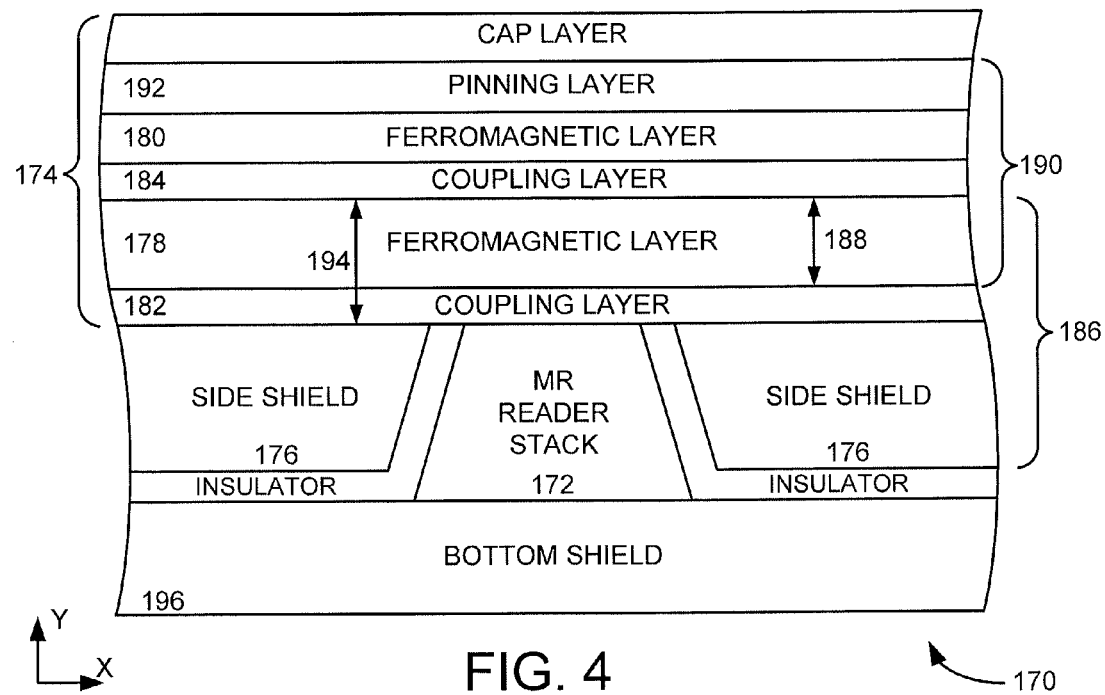
FIG. 4 displays a block representation of an example magnetic element capable of being used in the data storage device of FIG. 1 in various embodiments.

FIG. 4 generally illustrates an ABS portion of an example magnetic data reader 170 tuned in response the design of the magnetic reader stack 172 in accordance with various embodiments. In the embodiment shown in FIG. 4, the magnetic reader stack 172 is configured as a magnetoresistive (MR) lamination of layers that has a fixed magnetization reference layer and a long stripe height, characterized as a length from the ABS greater than twice the width of the reader stack 172 at the ABS. Such a reader stack 172 construction can correspond to top 174 and side 176 shield configurations that differ from shielding of a trilayer reader stack that has no fixed magnetizations and relies on external components, such as a rear bias magnet, to set a default magnetization.

As shown by the laminated top shield 174, first 178 and second 180 ferromagnetic layers respectively contact first 182 and second 184 coupling layers that are tuned in response to the increased magnetic stiffening of the top 174 and side 176 shields due to the antiferromagnetic coupling stemming from the formation of the SAFS 186 on either side of the reader stack 172. Such tuning may construct the first 182 and second 184 coupling layers of similar or dissimilar materials, such as different transition metals, and thicknesses that correspond to the configuration of the first 178 and second 180 ferromagnetic layers. That is, the coupling layers 182 and 184 can be constructed to combine with the similar or dissimilar material and thickness 188 configuration of the first 178 and second 180 ferromagnetic layers to provide predetermined magnetic stiffness in the shields 174 and 178 and predetermined antiferromagnetic coupling between the top 174 and side 176 shields.

Such tuned configuration may promote side shield 176 magnetization aligned with a pinned magnetization of the MR reader stack 172, which can allow the side shields 176 to stabilize the non-pinned portions of the reader stack 172 in a direction parallel to the ABS. Various embodiments tune the top shield 174 with a synthetic antiferromagnet 190 comprising the first 178 and second 180 ferromagnetic layers, second coupling layer 184, and a pinning layer 192. The synthetic antiferromagnet 190 can be tuned to have different magnetic strength than the SAFS 186 through adjustment of the thickness 188 of the first ferromagnetic layer 178, which can allow the top shield 174 to have a magnetic sensitivity than the coupled side shield 176.

The construction of dissimilar thicknesses 188 between the ferromagnetic layers 178 and 180 may complement, or be independent of, the placement of the second coupling layer 184 a predetermined distance 194 from the reader stack 172, such as 10 and 20 nm. Hence, the thickness 188 of the first ferromagnetic layer 178 can be tuned for magnetic strength of the synthetic antiferromagnet 190, magnetic strength of the SAFS 186, and the distance 194 from the second coupling layer 184 to the reader stack 172, which can provide magnetic stability with a predetermined balance between magnetic degradation and magnetic sensitivity.

While the various tuned layers are displayed as a part of the top shield 174, such configuration is not limiting as the bottom shield 196 may be constructed as a lamination of layers that may or may not be coupled to one or more side shields 176. For example, the bottom shield 196 may have a coupling layer contacting a side shield 176 and a ferromagnetic layer that forms a synthetic antiferromagnet structure through the formation of antiferromagnetic coupling with the side shield 176 either individually or in combination with the top shield 174 antiferromagnetically coupling to the side shield 174. In some embodiments, one side shield 176 is coupled to the top shield 174 while the other side shield 176 is coupled to the bottom shield 196 to allow the antiferromagnetic coupling to be tuned to different magnetic characteristics, such as magnetic stiffness and stability, for the respective side shields 176.

Figure 5:
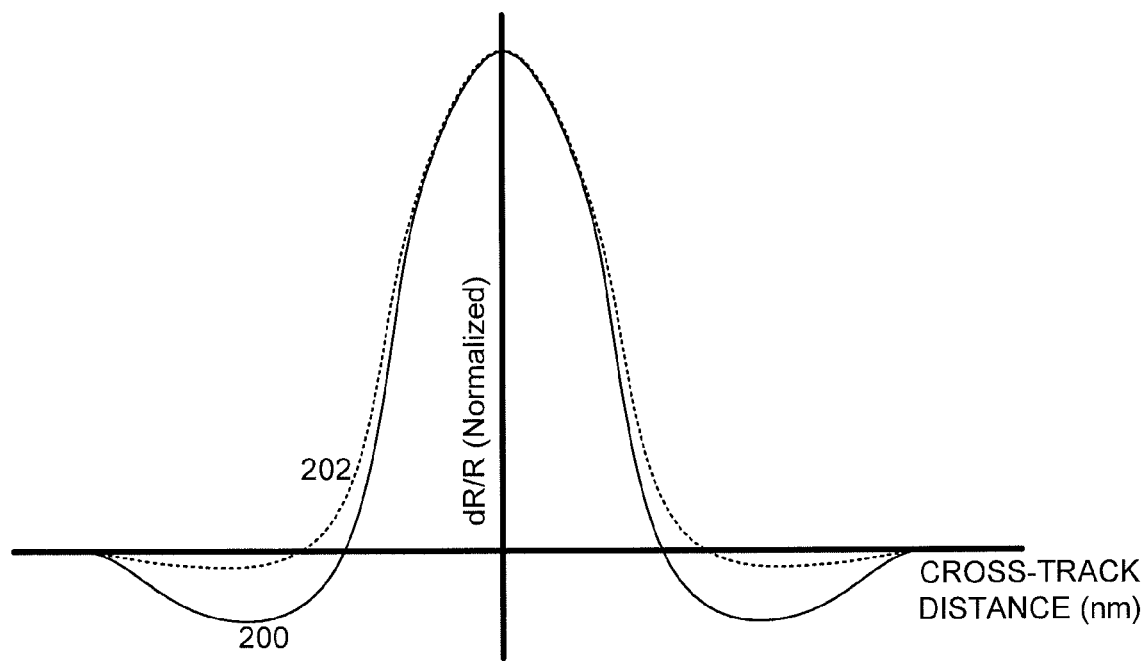
FIG. 5 graphs operational data from an example magnetic element constructed and operated in accordance with some embodiments.
Figure 6:
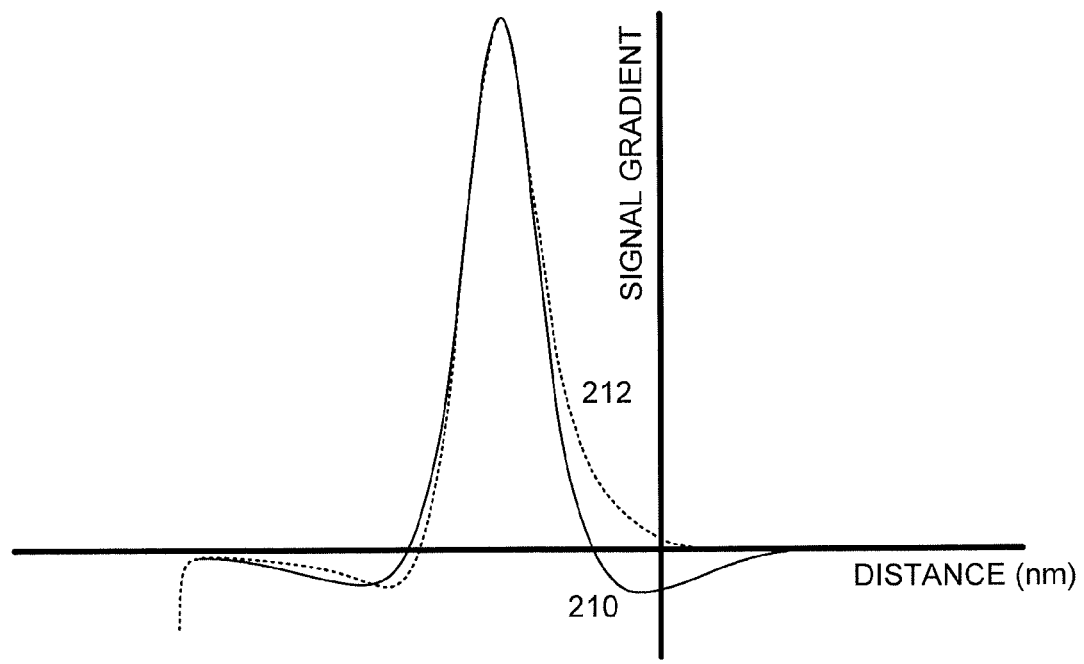
FIG. 6 plots various operational data from an example magnetic element constructed and operated in accordance with various embodiments.

With the various tuning mechanism capable in by adjusting the material, thickness, and placement of the various ferromagnetic and coupling layers, the ability to accurately read high areal bit density data storage environments at faster speeds is increased as side reading from adjacent data tracks and magnetic noise are mitigated. FIGS. 5 and 6 respectively plot operational data of example magnetic data readers tuned and operated in accordance with various embodiments.

In FIG. 5, a magnetic data reader was configured with a first Ruthenium coupling layer contacting the side shields and a second Ruthenium coupling layer positioned a predetermined distance from the reader stack. Solid line 200 graphs the normalized readback signal from the reader stack in relation to the distance from the centerline of the reader stack when the second coupling layer is positioned approximately 20 nm from the reader stack. Meanwhile, segmented line 202 charts the readback signal when a permanent magnet side shield that is not coupled to the top shield is used.

It can be appreciated from the data shown in lines 200 and 202 in FIG. 5 that the positioning of a Ruthenium coupling layer ~20 nm from the reader stack provides increased magnetic performance compared with the used of non-coupled permanent magnet side shields. Such increased magnetic performance may be illustrated by optimized signal strength versus position of a data bit in relation to the reader stack's centerline, which can be characterized as MT10 and MT50. Such magnetic performance may further be tuned with the adjustment of the ferromagnetic layer thicknesses in the top shield, as shown by FIG. 6.

Solid line 210 and segmented line 212 respectively illustrate how readback signal gradient varies as a ferromagnetic layer, such as layer 178 disposed between two coupling layers, is adjusted. As displayed in FIG. 6, the performance of solid line 210, which corresponds to a ferromagnetic layer of approximately 60 nm, is increased while not suffering from degraded PW50 values. In contrast, a ferromagnetic layer of approximately 10 nm thickness, as represented by segmented line 212, exhibits greater reliance on data bits being centered on the reader stack, which degrades PW50 values and the accuracy of a magnetic data reader in high areal bit density environments.

Figure 7:
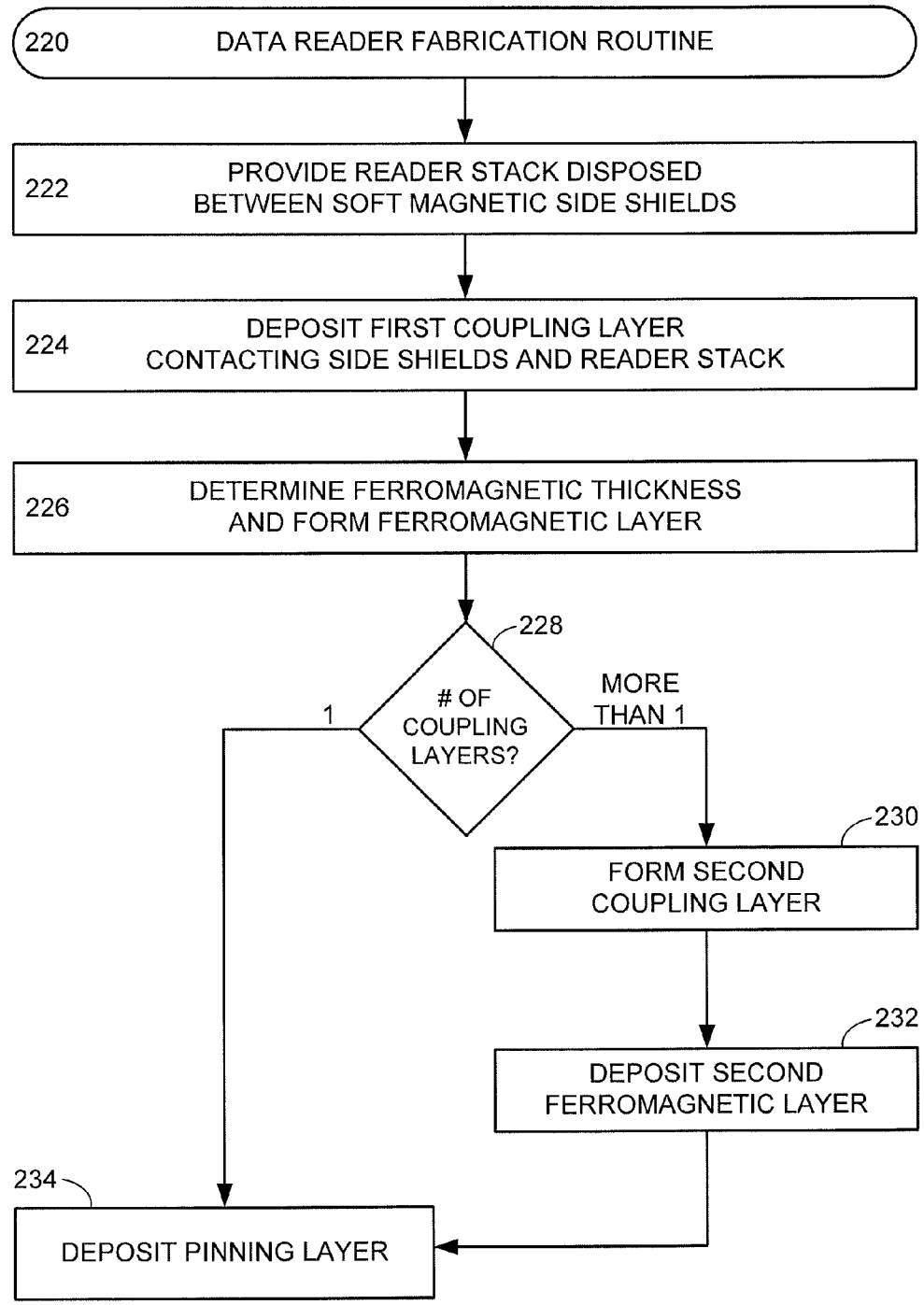
FIG. 7 provides a flowchart mapping an element fabrication routine conducted in accordance with various embodiments of the present invention.

While the tuning and construction of a magnetic data reader can be conducted in a variety of non-limiting processes, FIG. 7 provides an example data reader fabrication routine 220 conducted in accordance with some embodiments. A reader stack that is disposed between soft magnetic side shields is provided in step 222. The reader stack may be formed on a bottom shield, in some embodiments, while the side shields are magnetically and electrically isolated from the bottom shield by insulating layers, as shown in FIGS. 3 and 4.

Step 224 proceeds to deposit a first coupling layer as a continuous film contacting the side shields and reader stack. The first coupling layer may be constructed of a transition metal, like Ruthenium or Tantalum, to allow the side shields to antiferromagnetically couple to the top shield. Deposition of the first coupling layer advances routine 220 to step 226 where a first ferromagnetic layer is designed at least for thickness and then formed with that thickness.

Decision 228 next evaluates the number of coupling layers to be included in the top shield. Reference can be made to FIGS. 3 and 4 to see how multiple coupling layers can be implemented into the top shield. If more than one coupling layer is to be installed, step 230 forms the second coupling layer atop the first ferromagnetic layer, a predetermined distance from the reader stack. Next, step 232 deposits a second ferromagnetic layer on the second coupling layer to create dual synthetic antiferromagnets between the top and side shields.

Regardless of whether multiple coupling layers are chosen in decision 228, a pinning layer, such as an antiferromagnetic layer, is deposited in step 234 to fix the magnetization of the top shield, which corresponds with stabilizing the magnetization of the side shields. Through routine 220, a data reader tuned to have increased magnetic stability and resistance to demagnetization can be created. However, the routine 220 is not required or limited as the various decisions and steps can be omitted, changed, and added. For example, the material and shape of the side shields can be evaluated and constructed to be dissimilar configurations to provide varying magnetic bias on lateral sides of the reader stack.

It can be appreciated that the configuration and material characteristics of the magnetic data reader described in the present disclosure allows for tuned shielding that can optimize magnetic stability of the top and side shields. The ability to form a synthetic antiferromagnet structure with the side shield and part of the top shield allows for optimized magnetic stability with minimal demagnetization. Moreover, positioning tuned ferromagnetic and coupling layers in the top shield can provide dual synthetic antiferromagnet structures that further optimize magnetic stability without degrading magnetic performance, such as MT10, MT50 and PW50 values. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. A magnetic element comprising a magnetic reader contacting a top shield and separated from a side shield on an air bearing surface (ABS), the top shield comprising first and second ferromagnetic layers separated by a first coupling layer that forms a first synthetic antiferromagnet, the side shield antiferromagnetically coupled to the top shield via a second coupling layer of the top shield that forms a second synthetic antiferromagnet with the second ferromagnetic layer, the first and second ferromagnetic layers having different thicknesses to provide different magnetic strengths for the first and second synthetic antiferromagnets.

2. The magnetic element of claim 1, wherein the first synthetic antiferromagnet comprises a pinning layer, the first coupling layer, and the first and second ferromagnetic layers.

3. The magnetic element of claim 1, wherein the first and second coupling layers are common materials.

4. The magnetic element of claim 1, wherein the second coupling layer comprises a transition metal.

5. The magnetic element of claim 1, wherein the second coupling layer continuously extends to contact the side shield and magnetic reader.

6. The magnetic element of claim 1, wherein the side shield comprises a single layer of ferromagnetic material.

7. The magnetic element of claim 1, wherein the top shield comprises a pinning layer contacting the first ferromagnetic layer.

8. The magnetic element of claim 7, wherein the pinning layer comprises an antiferromagnet.

9. The magnetic element of claim 1, wherein the side shield comprises a soft magnetic material pinned to a predetermined magnetic orientation.

10. The magnetic element of claim 1, wherein the magnetic reader comprises a trilayer lamination of magnetically free layers without a fixed reference structure.

11. The magnetic element of claim 1, wherein the magnetic reader comprises a magnetoresistive lamination of fixed and free magnetic layers.

12. A data reader comprising:
a magnetic reader disposed between and separated from first and second side shields on an air bearing surface (ABS); and
a top shield comprising first and second ferromagnetic layers separated by a first coupling layer that forms a first synthetic antiferromagnet, the top shield contacting the first and second side shields and the magnetic reader, each side shield forming a second synthetic antiferromagnet by antiferromagnetically coupling to the top shield via a second coupling layer of the top shield, the first and second ferromagnetic layers having different thicknesses to provide different magnetic strengths for the first and second synthetic antiferromagnets.

13. The data reader of claim 12, wherein the second coupling layer continuously extends from the first side shield to the second side shield across the magnetic reader and the second coupling layer is separated from the first coupling layer by a the second ferromagnetic layer.

14. The data reader of claim 12, wherein the first coupling layer is separated from and positioned a predetermined distance from the magnetic reader.

15. The data reader of clam 12, wherein the second coupling layer comprises a transition metal that differs from the first coupling layer.

16. The data reader of claim 12, wherein the first coupling layer is disposed between the first ferromagnetic layer and the second ferromagnetic layers of the top shield.

17. The data reader of claim 12, wherein the first ferromagnetic layer is pinned to a predetermined magnetization by contacting a pinned layer.

18. The data reader of claim 12, wherein the first ferromagnetic layer has a smaller thickness than the second ferromagnetic layer.

19. An apparatus comprising:
a magnetic reader contacting a top shield and separated from a side shield on an air bearing surface (ABS); the top shield comprising first and second ferromagnetic layers;
means for antiferromagnetically coupling the side shield to the top shield with a first magnetic strength; and
means for antiferromagnetically coupling the first and second ferromagnetic layers of the top shield with a second magnetic strength that differs from the first magnetic strength.

20. The apparatus of claim 19, wherein the means for antiferromagnetically coupling the side shield to the top shield comprises a lamination of the side shield, a first coupling layer, and the first ferromagnetic layer, the means for antiferromagnetically coupling the first and second ferromagnetic layers of the top shield comprising a lamination of the first coupling layer, the first ferromagnetic layer, a second coupling layer, the second ferromagnetic layer, and a pinning layer.

* * * * *

UNITED STATES PATENT AND TRADEMARK OFFICE
CERTIFICATE OF CORRECTION

| | | |
|---|---|---|
| PATENT NO. | : 8,760,820 B1 | Page 1 of 1 |
| APPLICATION NO. | : 13/690204 | |
| DATED | : June 24, 2014 | |
| INVENTOR(S) | : Shaun Eric McKinlay et al. | |

It is certified that error appears in the above-identified patent and that said Letters Patent is hereby corrected as shown below:

In the Claims

In Col. 7, Line 8
replace "by a the"
with "by the"

Signed and Sealed this
Thirty-first Day of March, 2015

Michelle K. Lee
*Director of the United States Patent and Trademark Office*